US012313685B2

(12) United States Patent
Takizawa et al.

(10) Patent No.: US 12,313,685 B2
(45) Date of Patent: May 27, 2025

(54) SHORT CIRCUIT DETECTION DEVICE FOR ROTATING ELECTRICAL MACHINE

(71) Applicant: Mitsubishi Generator Co., Ltd., Hyogo (JP)

(72) Inventors: Yuji Takizawa, Tokyo (JP); Atsushi Yamamoto, Tokyo (JP); Susumu Maeda, Tokyo (JP)

(73) Assignee: MITSUBISHI GENERATOR CO., LTD., Kobe (JP)

( * ) Notice: Subject to any disclaimer, the term of this patent is extended or adjusted under 35 U.S.C. 154(b) by 119 days.

(21) Appl. No.: 18/275,224

(22) PCT Filed: Mar. 10, 2021

(86) PCT No.: PCT/JP2021/009461
§ 371 (c)(1),
(2) Date: Aug. 1, 2023

(87) PCT Pub. No.: WO2022/190236
PCT Pub. Date: Sep. 15, 2022

(65) Prior Publication Data
US 2024/0302436 A1  Sep. 12, 2024

(51) Int. Cl.
*H02K 1/27* (2022.01)
*G01R 31/34* (2020.01)
(Continued)

(52) U.S. Cl.
CPC ......... *G01R 31/343* (2013.01); *G01R 31/346* (2013.01); *G01R 31/52* (2020.01); *H02K 7/1823* (2013.01)

(58) Field of Classification Search
CPC ..... G01R 31/346; G01R 31/52; G01R 31/343
See application file for complete search history.

(56) References Cited

U.S. PATENT DOCUMENTS

2022/0120822 A1  4/2022  Takizawa et al.
2022/0146593 A1  5/2022  Takizawa et al.
(Continued)

FOREIGN PATENT DOCUMENTS

JP   2825373 B2   11/1998
JP   6837619 B1   3/2021
(Continued)

OTHER PUBLICATIONS

International Search Report and Written Opinion mailed on May 11, 2021, received for PCT Application PCT/JP2021/009461, filed on Mar. 10, 2021, 9 pages including English Translation.

*Primary Examiner* — Alesa Allgood
(74) *Attorney, Agent, or Firm* — XSENSUS LLP

(57) ABSTRACT

A short circuit detection device for a rotating electrical machine includes: a signal processing device including a signal acquisition unit, a signal decomposing unit, a specific frequency component reducing unit, a signal conversion unit, and a short circuit detection unit; and a magnetic detector placed inside a stator, and detects short circuit of a field winding. The signal decomposing unit decomposes a voltage signal from the signal acquisition unit into a plurality of frequency components having different orders. The specific frequency component reducing unit reduces frequency components for odd-number orders and frequency components for even-number orders higher than a threshold less than a fundamental order of a slot harmonic. The signal conversion unit performs conversion to a voltage signal. The short circuit detection unit generates a difference waveform between voltage signals corresponding to magnetic poles, and detects short circuit of the field winding and a short circuit position thereof.

20 Claims, 12 Drawing Sheets

(51) Int. Cl.
*G01R 31/52* (2020.01)
*H02K 7/18* (2006.01)

(56) References Cited

U.S. PATENT DOCUMENTS

2022/0390519 A1   12/2022  Takizawa et al.
2023/0204667 A1*  6/2023  Takizawa ............... G01R 31/52
                                                  324/765.01

FOREIGN PATENT DOCUMENTS

| WO | 2020/183610 A1 | 9/2020 |
| WO | 2020/208812 A1 | 10/2020 |
| WO | 2021/130987 A1 | 7/2021 |
| WO | 2022/009330 A1 | 1/2022 |

\* cited by examiner

SHORT CIRCUIT DETECTION DEVICE FOR ROTATING ELECTRICAL MACHINE

CROSS-REFERENCE TO RELATED APPLICATIONS

The present application is based on PCT filing PCT/JP2021/009461, filed Mar. 10, 2021, the entire contents of which are incorporated herein by reference.

TECHNICAL FIELD

The present disclosure relates to a short circuit detection device for a rotating electrical machine.

BACKGROUND ART

For detecting short circuit occurring at a field winding of a rotating electrical machine, for example, in a conventional configuration described in Patent Document 1, change in a field magnetic flux due to short circuit of a field winding of a rotor is detected by a probe having a pickup coil therein. The probe is provided with such a mechanism that allows the probe co slide in the radial direction through a cooling air flow duct provided in the axial direction of a stator core so as not to be obstacle at the time of extraction or re-insertion of the rotor. During operation of a rotating electrical machine, the probe is fixed so as to extend closely to the rotor, in a gap.

CITATION LIST

Patent Document

Patent Document 1: Japanese Patent No. 2825373

SUMMARY OF THE INVENTION

Problems to be Solved by the Invention

In the conventional configuration described in Patent Document 1, it is required to have a movable mechanism that allows the probe to slide and a probe structure having a sufficient strength against vibration due to cooling air flowing in the gap between the stator and the rotor, and a complicated large-sized structure is required for detecting short circuit of the field winding.

The present disclosure has been made to solve the above problem, and an object of the present disclosure is to provide a short circuit detection device for a rotating electrical machine, that is capable of reliably detecting short circuit of a field winding of a rotor while having a small-sized and simple configuration.

Solution to the Problems

A short circuit detection device for a rotating electrical machine according to the present disclosure includes: a magnetic detector placed so as to be opposed to a field winding provided to a plurality of slots of a rotor of the rotating electrical machine; and a signal processing device for processing a signal from the magnetic detector, and detects short circuit of the field winding. The magnetic detector is placed inside a stator provided with a gap from the rotor. The signal processing device includes: a signal acquisition unit which acquires a voltage signal which is the signal from the magnetic detector; a signal decomposing unit which decomposes the voltage signal acquired by the signal acquisition unit, into a plurality of frequency components having different orders; a specific frequency component reducing unit which reduces, among the plurality of frequency components, a frequency component for an odd-number order and a frequency component for an even-number order higher than a threshold which is set to be an order lower than a fundamental order of a slot harmonic which is a harmonic having a correlation with a pitch of the plurality of slots; a signal conversion unit which converts a plurality of frequency components outputted from the specific frequency component reducing unit, to a voltage signal; and a short circuit detection unit which divides the voltage signal converted by the signal conversion unit, into voltage signals for respective circumferential-direction angles around the rotor respectively corresponding to a plurality of magnetic poles of the rotor, and generates a difference waveform between the voltage signals corresponding to adjacent magnetic poles among the plurality of magnetic poles. On the basis of a shape of the difference waveform, the short circuit detection unit detects short circuit of the field winding, and estimates a position in a circumferential direction around the rotor where the short circuit has occurred.

Effect of the Invention

The short circuit detection device for a rotating electrical machine according to the present disclosure can reliably detect short circuit of a field winding of a rotor while having a small-sized and simple configuration.

DESCRIPTION OF EMBODIMENTS

Embodiment 1

Hereinafter, an embodiment will be described with reference to the drawings.

Figure 1:
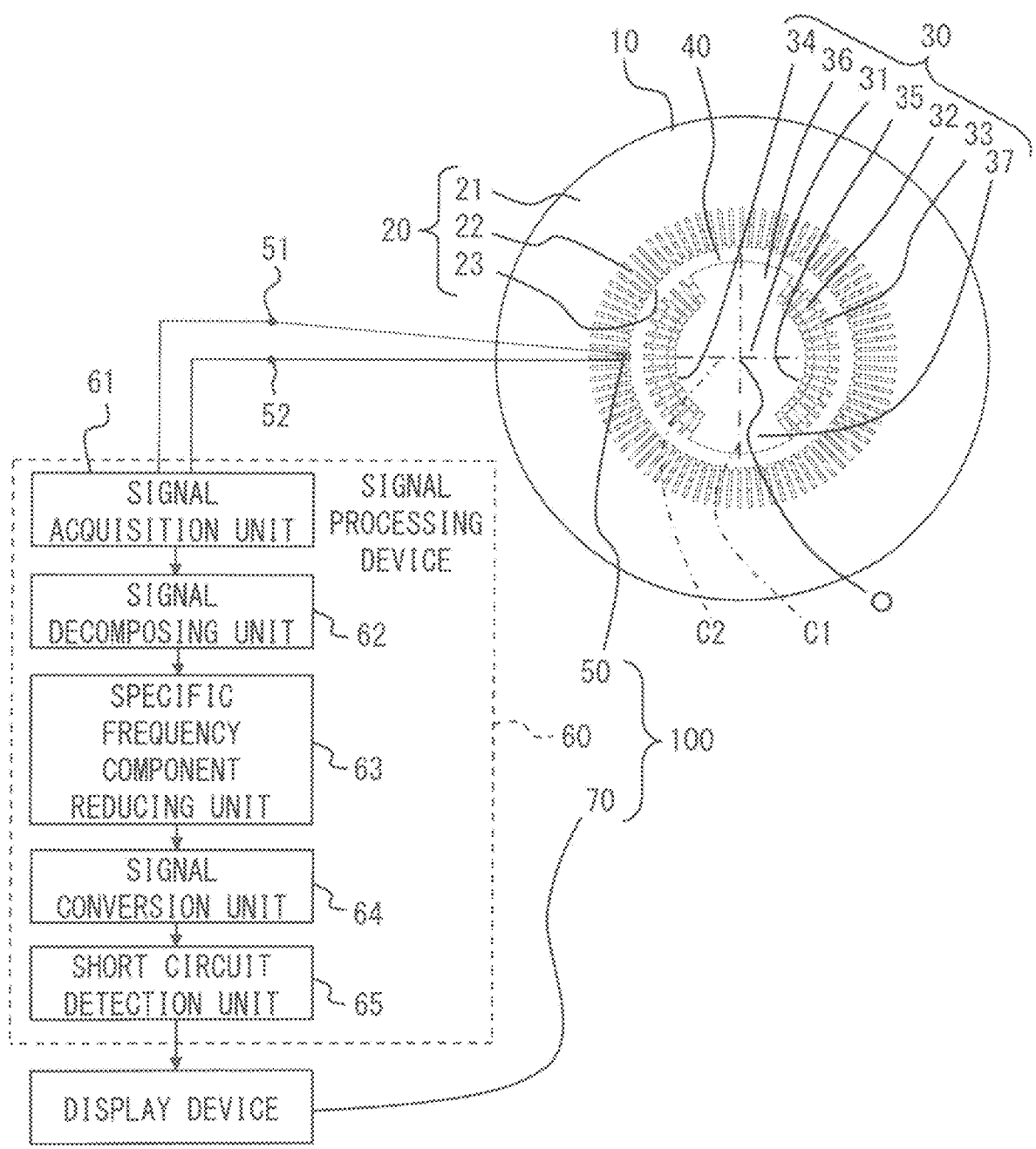
FIG. 1 is a configuration diagram showing a rotating electrical machine and a short circuit detection device according to embodiment 1.

FIG. 1 is a configuration diagram showing a rotating electrical machine and a short circuit detection device according to embodiment 1. In embodiment 1, a turbine electric generator 10 is used as the rotating electrical machine. In FIG. 1, the turbine electric generator 10 is shown by a cross-section perpendicular to the axial direction of the turbine electric generator 10.

As shown in FIG. 1, the turbine electric generator 10 includes a stator 20 as an armature and a rotor 30 as a field system. The stator 20 includes a cylindrical stator core 21 and a multiphase winding 22. The stator 20 is provided on the outer side of the rotor 30.

The axial direction of the stator core 21 is a direction along the axis of the stator core 21 and is perpendicular to the drawing sheet of FIG. 1. The radial direction of the stator core 21 is the radial direction of a circle centered at the axis of the stator core 21. The circumferential direction of the stator core 21 is a direction along an arc centered at the axis of the stator core 21.

In an inner circumferential part of the stator core 21, a plurality of stator slots 23 are formed. Each stator slot 23 is formed along the radial direction of the stator core 21. The plurality of stator slots 23 are arranged at an equal pitch in the circumferential direction of the stator core 21. In embodiment 1, the total number of the stator slots 23 is eighty-four. The multiphase winding 22 is wound through the plurality of stator slots 23.

The rotor 30 includes a rotor core 31, a field winding 32, and a rotary shaft (not shown). The rotor core 31 and the rotary shaft are arranged coaxially with the stator core 21. The rotor 30 is rotatable about the rotary shaft.

The axial direction of the rotor core 31 is a direction along an axis O of the rotor core 31 and is perpendicular to the drawing sheet of FIG. 1. The radial direction of the rotor core 31 is the radial direction of a circle centered at the axis O of the rotor core 31. The circumferential direction of the rotor core 31 is a direction along an arc centered at the axis O of the rotor core 31.

In an outer circumferential part of the rotor core 31, a plurality of rotor slots 33 are formed. Each rotor slot 33 is formed along the radial direction of the rotor core 31.

In embodiment 1, the plurality of rotor slots 33 are separated into a first slot group 34 and a second slot group 35. The first slot group 34 and the second slot group 35 each include sixteen rotor slots 33. That is, the total number of the rotor slots 33 is thirty-two.

In the first slot group 34 and the second slot group 35, the plurality of rotor slots 33 are arranged at an equal pitch in the circumferential direction of the rotor core 31. The pitch of the rotor slots 33 is the distance between the width-direction centers of two rotor slots 33 adjacent in the circumferential direction of the rotor core 31. The pitch of the rotor slots 33 in embodiment 1 is 7.42° when represented by a circumferential-direction angle around the rotor core 31. Hereinafter, the pitch of the rotor slots 33 is referred to as a rotor slot pitch Sp.

A first magnetic pole 36 and a second magnetic pole 37 are formed between the first slot group 34 and the second slot group 35. In FIG. 1, a dotted-dashed line passing the axis O of the rotor core 31 and the centers of the first magnetic pole 36 and the second magnetic pole 37 in the circumferential direction of the rotor 30, is hereinafter referred to as a magnetic pole center line C1. The first slot group 34 and the second slot group 35 are arranged symmetrically with respect to the magnetic pole center ling C1.

A dotted-dashed line passing the axis O of the rotor core 31 and the centers of the first slot group 34 and the second slot group 35 in the circumferential direction of the rotor core 31, is hereinafter referred to as an inter-pole center line C2.

The plurality of rotor slots 33 are respectively referred to as a first slot, a second slot, . . . , an eighth slot in the order from the side close to the magnetic pole center line C1. In other words, the plurality of rotor slots 33 are respectively referred to as a first slot, a second slot, . . . , an eighth slot in the order from the side far from the inter-pole center line C2.

In the plurality of rotor slots 33, the field winding 32 is wound so as to reciprocate between the first slot group 34 and the second slot group 35 across the magnetic pole center line C1. Of the field winding 32, parts located in the adjacent rotor slots 33 are connected in series to each other.

The field winding 32 is excited with DC by an external power supply (not shown). Thus, one of the first magnetic pole 36 and the second magnetic pole 37 becomes an N pole, and the other becomes an S pole. That is, the turbine electric generator 10 is an electric generator with two poles.

A gap 40 is formed between the stator core 21 and the rotor core 31. The multiphase winding 22 is excited with AC by an external power supply (not shown). Thus, a rotating magnetic field is generated in the gap 40.

A short circuit detection device 100 is for detecting short circuit of the field winding 32 of the turbine electric generator 10, and includes a search coil 50 as a magnetic detector, a signal processing device 60 for processing a detection signal from the search coil 50, and a display device 70. The search coil 50 is placed inside the stator 20, and in this case, is fixed in one stator slot 23 of the stator core 21. The search coil 50 is opposed to the field winding 32 with the gap 40 therebetween.

A main magnetic flux and a leakage magnetic flux interlink the search coil 50. The main magnetic flux is a magnetic flux generated in the gap 40, and the leakage magnetic flux is a magnetic flux leaking from each rotor slot 33. A magnetic flux interlinking the search coil 50 is referred to as an interlinkage magnetic flux.

The search coil 50 has a first terminal 51 and a second terminal 52. When a magnetic flux interlinks the search coil 50, a voltage signal as a detection signal is induced between the first terminal 51 and the second terminal 52. The distribution of the interlinkage magnetic flux in the search coil 50 varies along with rotation of the rotor 30.

The signal processing device 60 includes, as function blocks, a signal acquisition unit 61, a signal decomposing unit 62, a specific frequency component reducing unit 63, a signal conversion unit 64, and a short circuit detection unit 65.

The signal acquisition unit 61 acquires a voltage signal induced in the search coil 50, The signal decomposing unit 62 decomposes the voltage signal acquired by the signal acquisition unit 61, into a plurality of frequency components having different orders. Further, the signal decomposing unit 62 separates each decomposed frequency component into an amplitude and a phase.

The specific frequency component reducing unit 63 sets, as a threshold, an order of a frequency component lower than a fundamental order of a slot harmonic. The slot harmonic is a harmonic having a correlation with the rotor slot pitch Sp.

Further, the specific frequency component reducing unit 63 reduces frequency components for odd-number orders and frequency components for even-number orders higher than the threshold, among the separated amplitudes.

The signal conversion unit 64 sums all the phases and the amplitudes obtained after the reduction processing by the specific frequency component reducing unit 63, for the respective orders of the frequency components, thus converting them into a voltage signal after reduction of the specific frequency components.

The short circuit detection unit 65 divides the converted voltage signal after specific frequency component reduction, into voltage signals for respective circumferential-direction angles around the rotor 30 respectively corresponding to the first magnetic pole 36 and the second magnetic pole 37 of the rotor 30. Further, the short circuit detection unit 65 generates a difference waveform between the voltage signals corresponding to the first magnetic pole 36 and the second magnetic pole 37. Then, on the basis of the shape of the difference waveform, the short circuit detection unit 65 detects short circuit of the field winding 32, and estimates the position in the circumferential direction around the rotor 30 where the short circuit of the field winding 32 has occurred.

Further, the short circuit detection unit 65 outputs information about whether or not short circuit of the field winding 32 has occurred and the position of the rotor slot 33 where the short circuit has occurred, to the display device 70.

The display device 70 is provided outside the signal processing device 60. The display device 70 displays whether or not short circuit of the field winding 32 has occurred and the position of the rotor slot 33 where the short circuit has occurred, on the basis of the information from the short circuit detection unit 65.

The display device 70 may be provided outside the Short circuit detection device 100.

The search coil 50 placed in the stator slot 23 will be described below.

Figure 2:
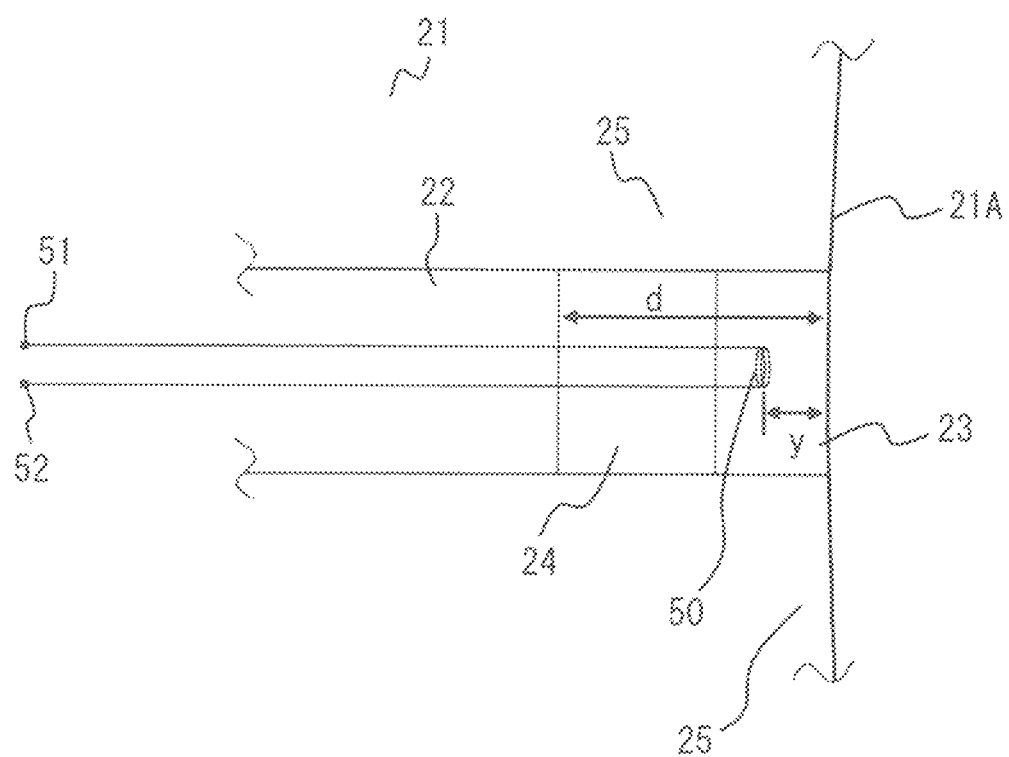
FIG. 2 illustrates the position of a search coil according to embodiment 1.

FIG. 2 illustrates the position of the search coil 50. As shown in FIG. 2, the search coil 50 is fixed to a stator wedge 24 provided inside the stator slot 23 between two teeth 25. The stator wedge 24 is made of a nonmagnetic material, and is provided on the outer side (opening side) of the multiphase winding 22, inside the stator slot 23. The search coil 50 is also placed on the outer side of the multiphase winding 22, inside the stator slot 23.

A radial-direction distance y from the radial-direction position of the opening face of the stator slot 23, i.e., the radial-direction position of a tooth end 21A, to the position where the search coil 50 is placed, is smaller than a radial-direction distance d from the radial-direction position of the tooth end 21A to the surface of the multiphase winding 22. Thus, 0<y<d is satisfied.

As current flowing through the field winding 32 increases, the main magnetic flux also increases, and therefore the stator core 21 gradually reaches magnetic saturation. Since a magnetic flux leaks from the magnetically saturated stator core 21 to the stator slot 23, the influence of change in the magnetic flux amount of the main magnetic flux irrelevant to short circuit of the field winding 32 becomes greater than the influence of change in the magnetic flux amount caused by the short circuit. As a result, it becomes difficult to accurately detect the fact that short circuit has occurred or the position of the rotor slot 33 where short circuit has occurred.

Figure 3:
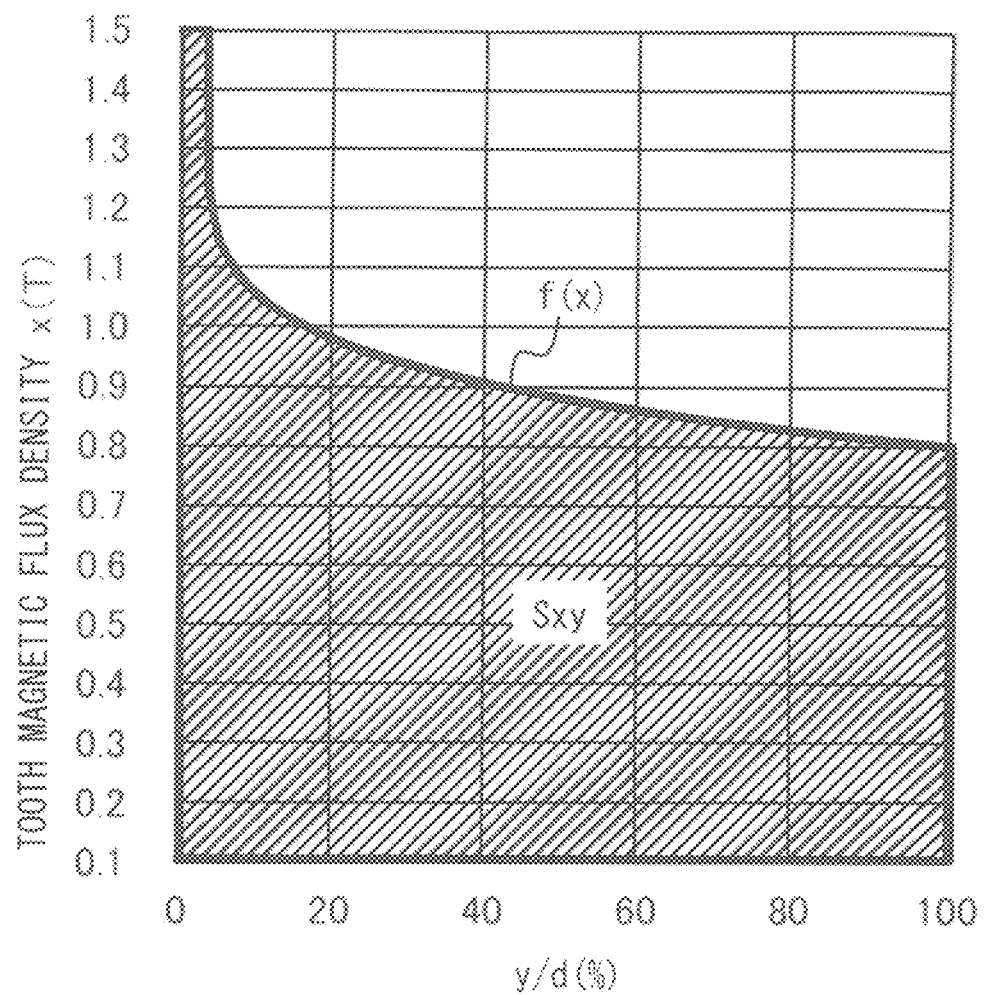
FIG. 3 shows the range of the position of a search coil with respect to a magnetic flux density, according to embodiment 1.

FIG. 3 shows the range of the position of the search coil with respect to the magnetic flux density.

Here, under the condition that current of the field winding 32 is gradually increased until the stator core 21 is magnetically saturated, a position range Sxy of the search coil 50 with respect to the magnetic flux density at the tooth end 21A of the stator core 21 adjacent to the stator slot 23, is shown. The vertical axis indicates a maximum magnetic flux density×[T] (T: tesla) at the tooth end 21A. The horizontal axis indicates, by percentage (%), a ratio (y/d) of the radial-direction distance y to the position where the search coil 50 is placed relative to the radial-direction distance d to the surface of the multiphase winding 22, from the tooth end 21A as a reference of a radial direction position.

As shown in the graph, the search coil 50 is placed in a range where the ratio (y/d) is within 0 to 100% and is limited by a function f(x) of the maximum magnetic flux density x. The position range Sxy is such a position range of the search coil 50 that erroneous detection of short circuit does not occur, inside the stator slot 23. The function f(x) was obtained through simulation of a no-load operation state of the turbine electric generator 10 in FIG. 1. That is, the function f(x) is set so that short circuit of the field winding 32 is not erroneously detected, under the condition until the stator core 21 is magnetically saturated.

Here, erroneous detection means that occurrence of short circuit of the field winding 32 and the short circuit position thereof are erroneously detected. The details thereof will be described later.

The function f(x) is represented by the following expression using the maximum magnetic flux density×[T].

$$f(x) = 801 \times 5.9((1.5-x)^{\wedge}(5.9)) + 3.6$$

In general, in a region where the magnetic flux density at the tooth 25 is greater than 1 T, magnetic saturation is more likely to occur as compared to a region not greater than 1 T, and due to general magnetic characteristics of stacked steel sheets of the stator core 21, magnetic flux leakage sharply increases exponentially as the magnetic flux density increases. That is, also in the present embodiment, as the magnetic flux density indicated on the vertical axis in FIG. 3 increases, the leakage magnetic flux from the tooth 25 to the stator slot 23 increases. As the leakage magnetic flux increases relative to the field magnetic flux from the rotor 30, the leakage magnetic flux acts as disturbance against the field magnetic flux detected by the search coil 50.

Therefore, as the magnetic flux density increases, the position range Sxy of the search coil 50 is narrowed.

For example, in a case where short circuit detection is performed under the operation condition that the maximum magnetic flux density×[T] is not greater than 0.8, the location where short circuit of the field winding 32 has occurred can be estimated without erroneous detection, no matter which value the ratio (y/d) indicating the position of the search coil 50 takes among 0 to 100%.

Meanwhile, for example, in a case where short circuit detection is performed under the operation condition that the maximum magnetic flux density×[T] is not less than 1.0, the ratio (y/d) indicating the position of the search coil 50 is set to be less than 20% in order to normally estimate the short circuit location without erroneous detection.

In the stator slot 23 around which a magnetic material having nonlinear magnetic characteristics is present, the influence of change in the magnetic flux amount irrelevant to short circuit of the field winding 32 increases toward the slot bottom on the outer circumferential side. Therefore, in a case where detection for short circuit of the field winding 32 is performed under the operation condition that the magnetic flux density is high, the search coil 50 is placed near the slot opening around which the amount of magnetic material is small and where change in the magnetic flux amount due to short circuit of the field winding 32 is great.

Next, the signal processing device 60 of the short circuit detection device 100 will be described in more detail with reference to the drawings.

Figure 4:
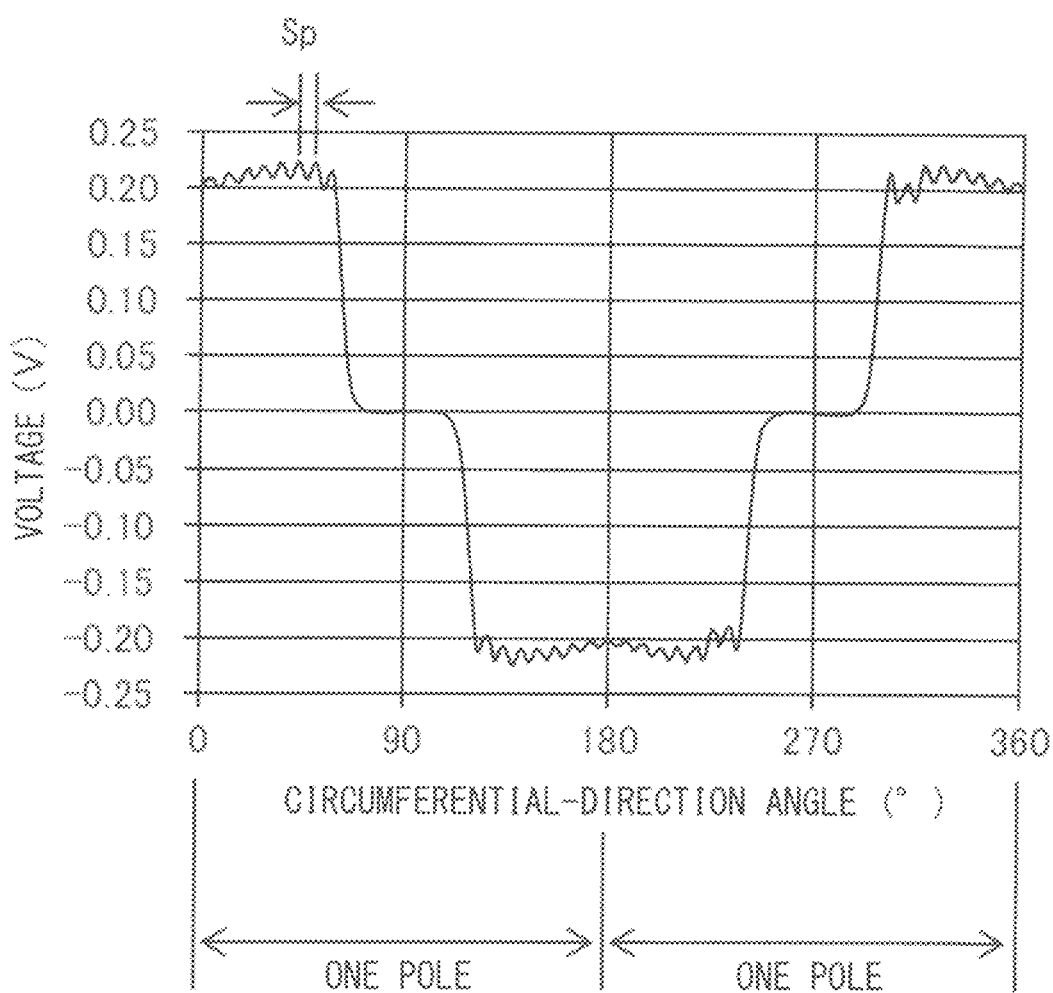
FIG. 4 is a waveform diagram showing an example of a voltage signal acquired by a signal acquisition unit according to embodiment 1.

FIG. 4 is a waveform diagram showing an example of a voltage signal acquired by the signal acquisition unit 61. This waveform diagram was obtained through simulation of a no-load operation state of the turbine electric generator 10 in FIG. 1, using an electromagnetic field analysis program.

The simulation was executed under the condition that only one turn of the field winding 32 is short-circuited in the second slot on the first magnetic pole 36 side, for example. Therefore, an example described below with reference to the waveform diagram in FIG. 4 is a case where only one turn of the field winding 32 is short-circuited in the second slot on the first magnetic pole 36 side.

As shown in FIG. 4, for example, a circumferential-direction angle range of 0° to 180° corresponds to the first magnetic pole 36, and a circumferential-direction angle range of 180° to 360° corresponds to the second magnetic pole 37. Therefore, at a circumferential-direction angle 90°, the center of the first magnetic pole 36 is closest to the search coil 50, and at a circumferential-direction angle 270°, the center of the second magnetic pole 37 is closest to the search coil 50. In the waveform diagram in FIG. 4, thirty-two fine voltage fluctuations occur on a rotor slot pitch Sp basis, i.e., a 7.42° basis.

Figure 5:
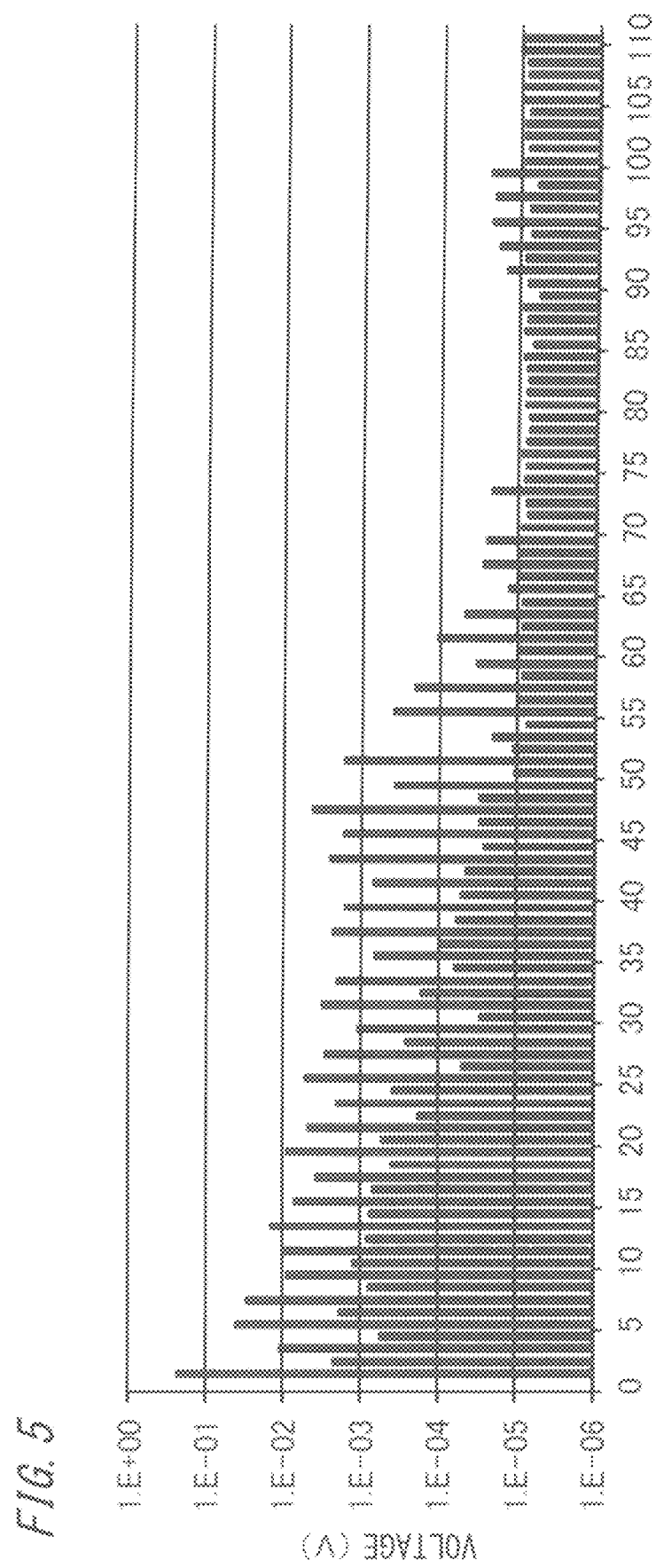
FIG. 5 is a spectrum graph showing a frequency spectrum of amplitude components of a voltage signal obtained through frequency analysis by a signal decomposing unit according to embodiment 1.

FIG. 5 is a spectrum graph showing a frequency spectrum of amplitude components of a voltage signal obtained through frequency analysis by the signal decomposing unit 62. The horizontal axis indicates an order n of a harmonic, and one bar of the bar graph in FIG. 5 indicates one order. In FIG. 5, harmonics up to 110th order are shown. Here, n is an integer not less than 1. Harmonics for orders not less than 111 are not shown because the amplitudes thereof are small. The vertical axis indicates the intensity of voltage of a harmonic for each order.

As shown in FIG. 5, the voltage intensity of a harmonic for an odd-number order is greater than the voltage intensity of a harmonic for an even-number order. Harmonics for odd-number orders occur irrespective of whether or not short circuit has occurred at the field winding 32. On the other hand, harmonics for even-number orders occur when short circuit has occurred at the field winding 32.

Among harmonics for odd-number orders, the voltage intensity of a harmonic for 1st order is particularly great. The harmonic for 1st order is also called a fundamental wave, and is a frequency component of the main magnetic flux.

Among harmonies for odd-number orders, a harmonic fox 47th order has a greater voltage intensity than harmonics therearound. The harmonic for 47th order is a slot harmonic and is a harmonic having a correlation with the rotor slot pitch Sp. The 47th order is a fundamental order of a slot harmonic. The slot harmonic occurs due to a difference between a magnetomotive force for 1st order of the rotor 30 and permeance change of the rotor slot pitch Sp. The permeance is a coefficient of conversion from the magnetomotive force to the magnetic flux density. In this case, a difference between the magnetomotive force order and the permeance order is 47, which is the order of the slot harmonic.

Harmonics for orders not less than 48 are harmonics corresponding to pitches narrower than the rotor slot pitch Sp, i.e., angles smaller than the rotor slot pitch Sp in the circumferential direction. The frequency components corresponding to angles smaller than the rotor slot pitch Sp are not necessary components for estimating the short circuit position of the field winding 32. Accordingly, the specific frequency component reducing unit 63 selects an order less than 47, as a threshold order for removing frequency components for even-number orders. Then, the specific frequency component reducing unit 63 removes frequency components for all even-number orders greater than the selected threshold.

The voltage intensity of the slot harmonic is higher than the voltage intensity of the frequency component for an odd-number order closer to the slot harmonic. Therefore, a frequency component for an even-number order closer to the order of the slot harmonic is more influenced by the slot harmonic and is more likely to be unstable. Accordingly, it is preferable that the threshold is set so as to remove frequency components for even-number orders that are more influenced by the slot harmonic.

In addition, a frequency component for an odd-number order becomes a factor for hampering detection of a frequency component for an even-number order. Meanwhile, a frequency component for an odd-number order contains information necessary for identifying the circumferential-direction angle. Specifically, including a frequency component fox an odd-number order makes it possible to determine on which of the magnetic pole sides the short circuit has occurred.

Therefore, it is not desirable that frequency components for odd-number orders are completely removed, in order to estimate the short circuit position of the field winding 32. Accordingly, the specific frequency component reducing unit 63 attenuates frequency components for odd-number orders instead of completely removing them.

More specifically, in embodiment 1, the specific frequency component reducing unit 63 sets the threshold at 12, and removes frequency components for even-number orders not less than 14. In addition, the specific frequency component reducing unit 63 attenuates frequency components fox all odd-number orders. In this case, frequency components for odd-number orders not greater than 11 are attenuated to 1/50, and frequency components for odd-number orders not less than 13 are attenuated to almost zero or removed.

As described above, in the present embodiment, reducing frequency components includes removing frequency components and attenuating frequency components.

Figure 6:
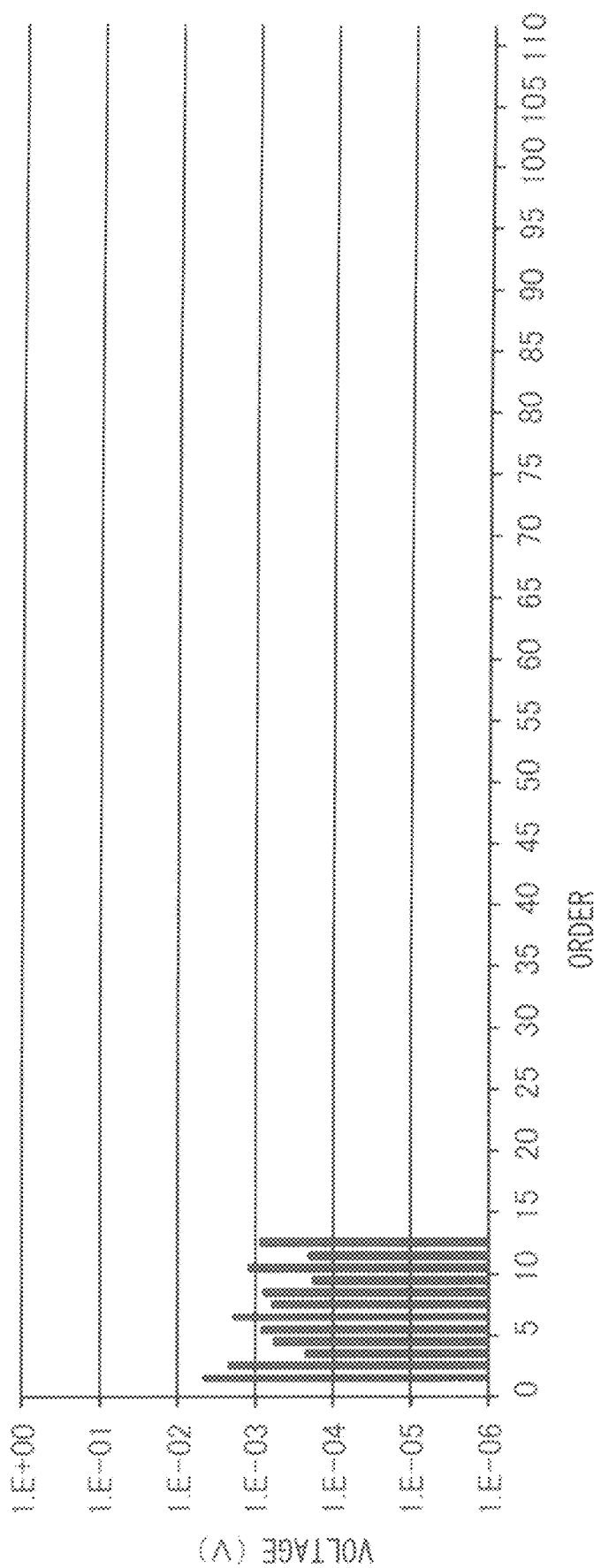
FIG. 6 is a spectrum graph showing a frequency spectrum of amplitude components after reduction processing by a specific frequency component reducing unit according to embodiment 1.

FIG. 6 is a spectrum graph showing a frequency spectrum of amplitude components after reduction processing by the specific frequency component reducing unit 63. As shown in FIG. 6, the frequency spectrum of amplitude components outputted from the specific frequency component reducing unit 63 includes frequency components for even-number orders of 2 to 12, and attenuated frequency components fox odd-number orders.

In this way, the specific frequency component reducing unit 63 reduces the frequency components for even-number orders higher than the threshold which is an order lower than the fundamental order of the slot harmonic, and the frequency components for odd-number orders, whereby it is possible to reduce a factor that hampers short circuit detection at the field winding 32. Thus, detection accuracy for short circuit can be improved.

Figure 7:
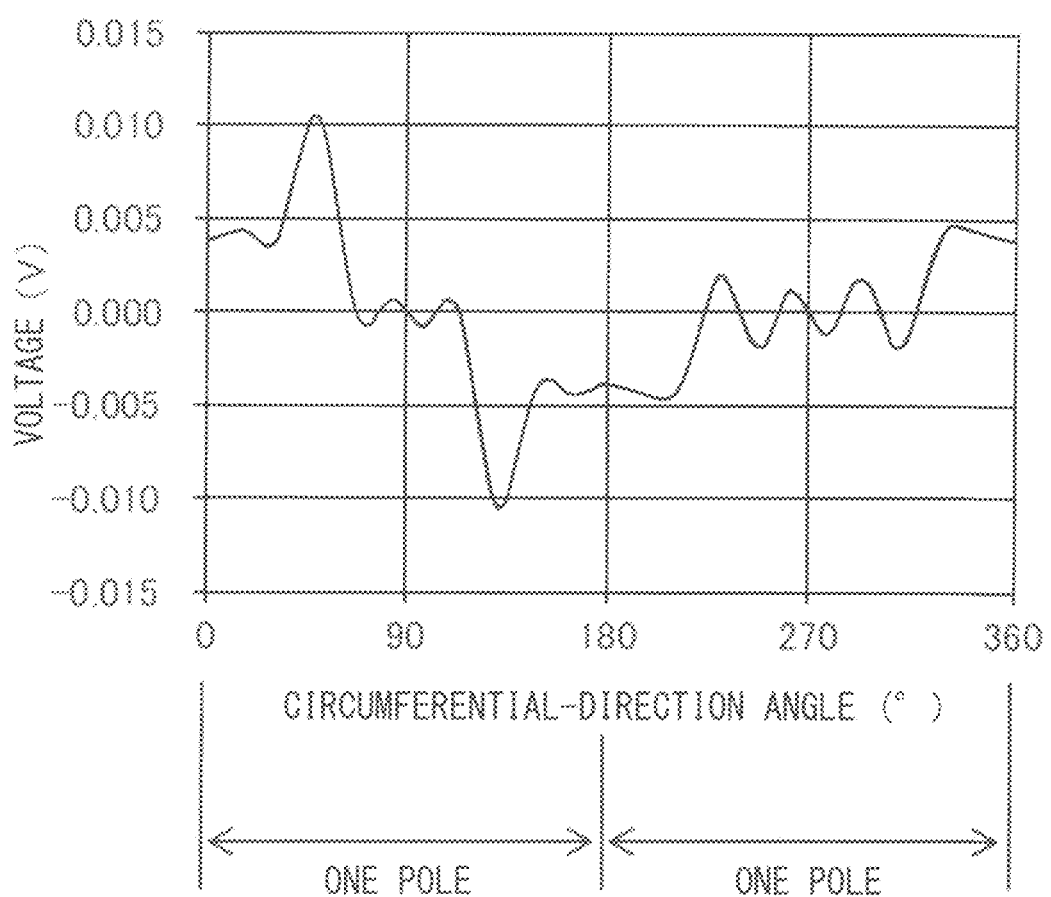
FIG. 7 shows a voltage signal converted by a signal conversion unit: according to embodiment 1.

FIG. 7 shows a voltage signal converted by the signal conversion unit 64.

The signal conversion unit 64 sums all the phases and the amplitudes after reduction processing by the specific frequency component reducing unit 63, for the respective orders of frequency components, thus converting them into a voltage signal. The converted voltage signal does not contain the slot harmonic component, and therefore, as shown in FIG. 7, the voltage fluctuation cycle is longer than that of the voltage signal shown in FIG. 4. In other words, in FIG. 7, a finely fluctuating waveform corresponding to the rotor slot pitch Sp does not appear.

Figure 8:
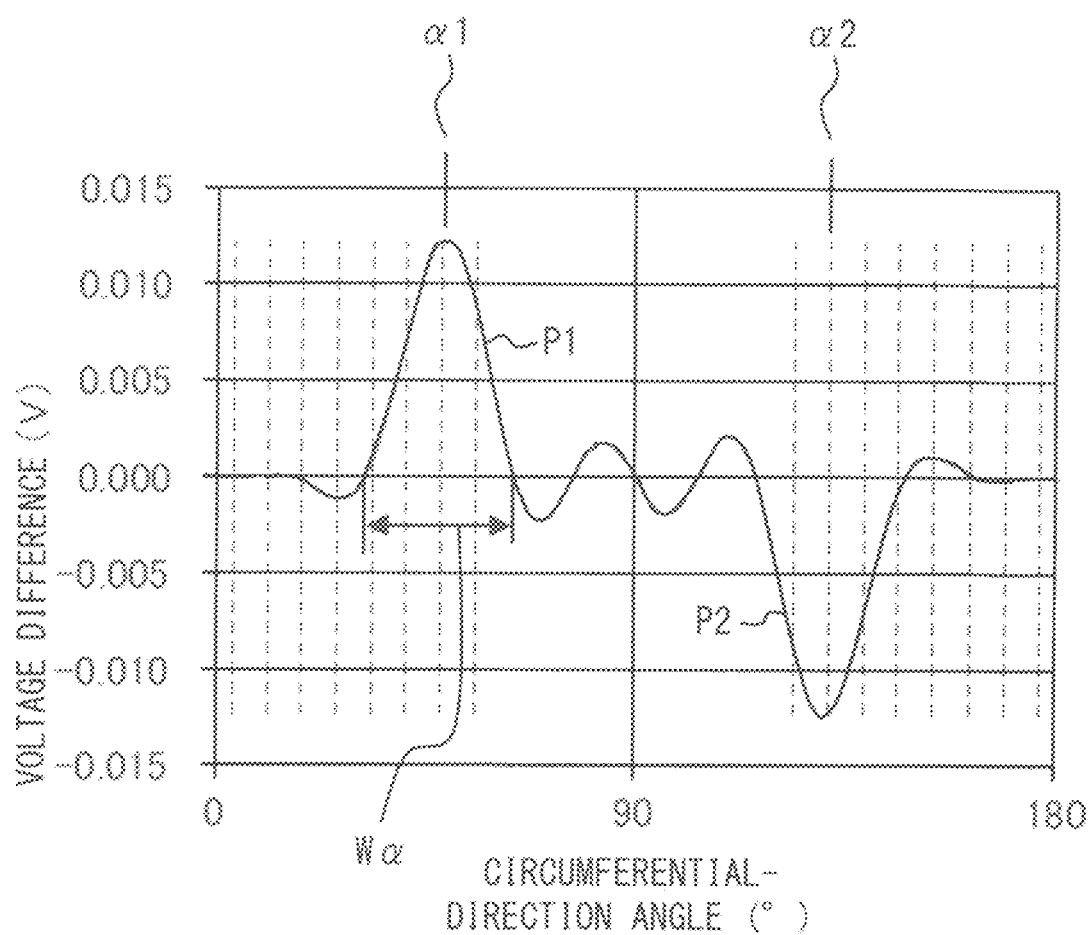
FIG. 8 shows a difference waveform obtained by a short circuit detection unit according to embodiment 1.

FIG. 8 shows a difference waveform obtained by the short circuit detection unit 65.

The short circuit detection unit 65 receives the voltage signal converted by the signal conversion unit 64. Then, the short circuit detection unit 65 divides the received voltage signal into voltage signals for respective circumferential-direction angles around the rotor 30 respectively corresponding to the first magnetic pole 36 and the second magnetic pole 37 of the rotor 30. Since the polarities of the first magnetic pole 36 and the second magnetic pole 37 are different from each other, the waveform in a range of 0° to 180° corresponding to the first magnetic pole 36 and the waveform in a range of 180° to 360° corresponding to the second magnetic pole 37 are added together, to generate a difference waveform between the voltage signals corresponding to the first magnetic pole 36 and the second magnetic pole 37.

That is, the difference waveform shown in FIG. 8 is obtained by dividing the waveform shown in FIG. 7 between the left and right sides and adding them together.

In the difference waveform in FIG. 8, a peak waveform P1 based on one wave of peak voltage in the positive direction appears at a position of 50°, and a peak waveform P2 based on one wave of peak voltage in the negative direction appears at a position of 130°. Here, "one wave" refers to one waveform in a range Wα from a circumferential-direction angle at which the absolute value of voltage is minimum on one side of peak voltage to a circumferential-direction angle at which the absolute value of voltage is minimum on the other side of peak voltage.

In FIG. 8, vertical broken lines indicate circumferential-direction angles of the first to eighth slots. The broken lines closest to 90° which corresponds to the center of the magnetic pole indicate the first slot, and the broken lines closest to 0° and 180° indicate the eighth slot. The interval between the adjacent broken lines corresponds to the rotor slot pitch Sp.

Thus, when the peak waveforms P1, P2 having a wider range Wα than the rotor slot pitch Sp appear in the difference waveform, this indicates that short circuit has occurred at the field winding 32.

The peak voltage at 50+ and the peak voltage at 130° are closest to broken lines α1, α2 both indicating the second slot. From this result, the short circuit detection unit 65 estimates that short circuit of the field winding 32 has occurred at the second slot.

As described above, when current flowing through the field winding 32 increases and the stator core 21 is magnetically saturated, a magnetic flux leaks from the stator core 21 to the stator slot 23, thus adversely affecting short circuit detection for the field winding 32.

Figure 9:
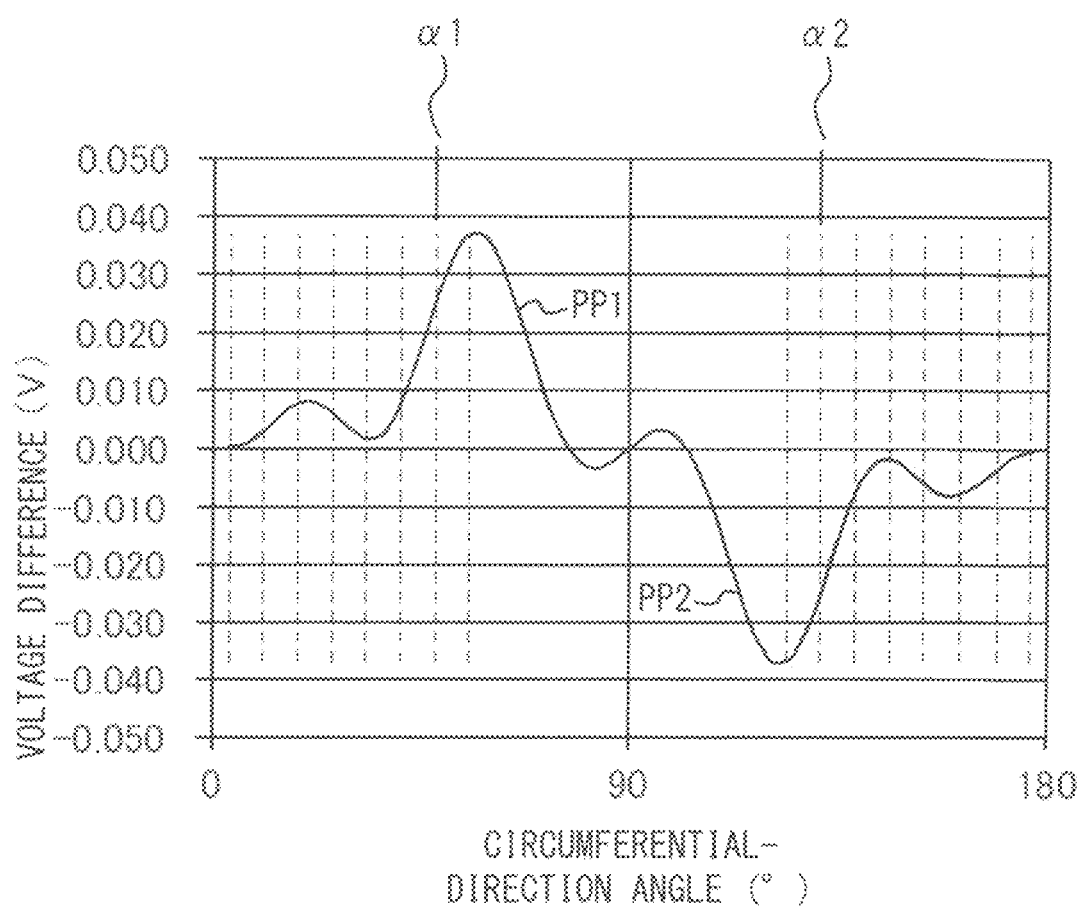
FIG. 9 shows a difference waveform obtained by a short circuit detection unit in a comparative example.

FIG. 9 shows a difference waveform obtained by the short circuit detection unit in a comparative example. In the comparative example shown in FIG. 9, it is assumed that the stator core 21 is magnetically saturated, and peak waveforms PP1, PP2 having peak voltages occur at circumferential-direction angles that do not correspond to the second slot where short circuit has actually occurred. In this case, the peak voltages of the peak waveforms PP1, PP2 are closest to the broken lines for the first slot instead of broken lines α1, α2 both indicating the second slot, so that it is erroneously estimated that short circuit of the field winding 32 has occurred at the first slot.

As shown in the comparative example, erroneous determination is performed as if short circuit has occurred at a slot where short circuit has not actually occurred, that is, erroneous detection in which the short circuit position is erroneously detected is performed. Regarding the erroneous detection, a condition in which such erroneous detection does not occur will be described below.

The condition in which erroneous detection does not occur is that a difference between the angle of the peak voltage of the peak waveform P1, P2 having a wider range than the rotor slot pitch Sp and appearing in the difference waveform obtained by the short circuit detection unit 65, and the angle of the rotor slot 33 where the short circuit has actually occurred, is less than ½ of the rotor slot pitch Sp. If this difference is not less than ½ of the rotor slot pitch Sp, erroneous detection is performed as if short circuit has occurred at an adjacent slot, or a slot next to this slot, where short circuit has not actually occurred.

As described above, in the present embodiment, since the search coil 50 is placed inside the stator slot 23, the search coil 50 does not become obstacle at the time of attaching/detaching the rotor 30, and also, is not directly exposed to a cooling air flow circulating at high speed in the gap 40 along with rotation of the rotor 30.

Therefore, the search coil 50 does not require a complicated probe of a movable type, and also, does not require a strong large-sized probe that can withstand vibration due to a cooling air flow. For example, the search coil 50 can be configured as a simple probe by being protected by a resin-solidified thin plate and then fixed to the stator wedge 24 by adhesion or the like, for example. Thus, the short circuit detection device 100 can reliably detect short circuit of the field winding 32 of the rotor 30 while having a small-sized and simple configuration.

In a case where the search coil 50 and the stator wedge 24 are far from each other, a fixation jig may be interposed between the stator wedge 24 and the search coil 50.

Inside the stator slot 23, the search coil 50 is placed in such a range that the distance to the radial-direction position of the tooth end 21A becomes smaller as the maximum magnetic flux density at the tooth end 21A of the stator 20 due to rotation of the rotor 30 becomes greater. Therefore, even in an operation condition of the turbine electric generator 10 in which the magnetic flux density is great, it is possible to reliably detect the position in the circumferential direction around the rotor 30 where short circuit of the field winding 32 has occurred.

The search coil 50 is placed in such a range that the ratio (y/d) of the radial-direction distance y to the position of the search coil 50 relative to the redial-direction distance d to the surface of the multiphase winding 22, from the tooth end 21A as a reference of the radial-direction position, is within 0 to 100% and is limited by the function f(x) of the maximum magnetic flux density x. That is, by placing the search coil 50 in the position range Sxy shown in FIG. 3, reliable short circuit detection for the field winding 32 can be easily and assuredly performed.

In embodiment 1, the number of the stator slots 23, the number of the rotor slots 33, the number of the magnetic poles 36, 37, and the rotor slot pitch Sp are not limited to the above examples.

For example, in a case where the number of magnetic poles is larger than two, the short circuit detection unit 65 may generate a difference waveform as follows. First, the short circuit detection unit 65 divides the voltage signal converted by the signal conversion unit 64, into voltage signals for respective circumferential-direction angles around the rotor 30 respectively corresponding to the plurality of magnetic poles of the rotor 30. Then, the short circuit detection unit 65 may generate a difference waveform between the voltage signals corresponding to the adjacent magnetic poles among the plurality of magnetic poles.

In embodiment 1, one rotor slot pitch Sp is present. However, a plurality of rotor slot pitches Sp may be present. In a case where a plurality of rotor slot pitches Sp are present, the order of a voltage component corresponding to the greatest rotor slot pitch Sp, i.e., a slot harmonic for the smallest order among the plurality of slot harmonics, may be regarded as a fundamental order of a slot harmonic and a threshold may be set accordingly. Thus, frequency components corresponding to all the rotor slot pitches Sp can be removed.

In embodiment 1, the specific frequency component reducing unit 63 may not necessarily reduce frequency components for all odd-number orders. That is, the specific frequency component reducing unit 63 may leave frequency components for some odd-number orders without reducing them, as long as frequency components for even-number orders can be detected.

In embodiment 1, the specific frequency component reducing unit 63 may not necessarily remove all of frequency components for even-number orders higher than the threshold. That is, the specific frequency component reducing unit 63 may attenuate frequency components for even-number orders higher than the threshold, as long as peak waveforms P1, P2 having wider ranges than the rotor slot pitch Sp are obtained in the difference waveform in the short circuit detection unit 65.

In embodiment 1, the signal decomposing unit 62 decomposes a voltage signal into a plurality of frequency components having different orders, and separates the plurality of frequency components into amplitudes and phases. Then, the specific frequency component reducing unit 63 performs processing of reducing specific frequency components, for the amplitudes. However, a method for decomposing the signal is not limited thereto.

For example, the signal decomposing unit 62 may decompose a voltage signal into a plurality of frequency components having different orders, and the specific frequency component reducing unit 63 may perform processing of reducing specific frequency components, for the plurality of frequency components that have been decomposed. Thus, processing of signal decomposition can be simplified.

In embodiment 1, the rotor 30 is provided on the inner circumferential side of the stator 20. However, the rotor 30 may be provided on the outer circumferential side of the stator 20.

In embodiment 1, the turbine electric generator 10 is used as the rotating electrical machine. However, the rotating electrical machine may be an electric generator other than the turbine electric generator 10, or may be an electric motor.

In embodiment 1, the search coil 50 is used as the magnetic detector. However, the magnetic detector is not limited thereto.

The function of the signal processing device 60 of embodiment 1 is implemented by a processing circuit.

Figure 10:
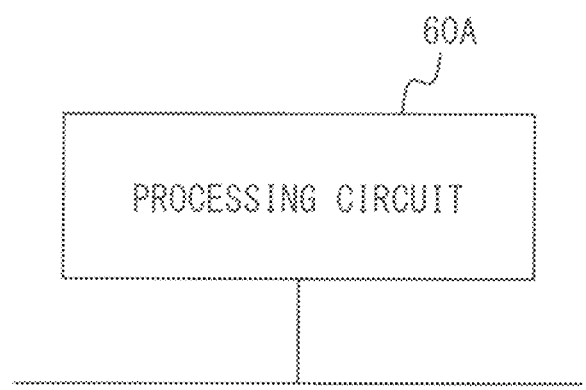
FIG. 10 is a configuration diagram showing an example of hardware for implementing functions of a signal processing device according to embodiment 1.

FIG. 10 is a configuration diagram showing an example of hardware for implementing the functions of the signal processing device 60. In this case, the signal processing device 60 is formed by a processing circuit 60A which is dedicated hardware.

The processing circuit 60A is, for example, a single circuit, a complex circuit, a programmed processor, a parallel-programmed processor, an application specific integrated circuit (ASIC), a field-programmable gate array (FPGA), or a combination thereof.

Figure 11:
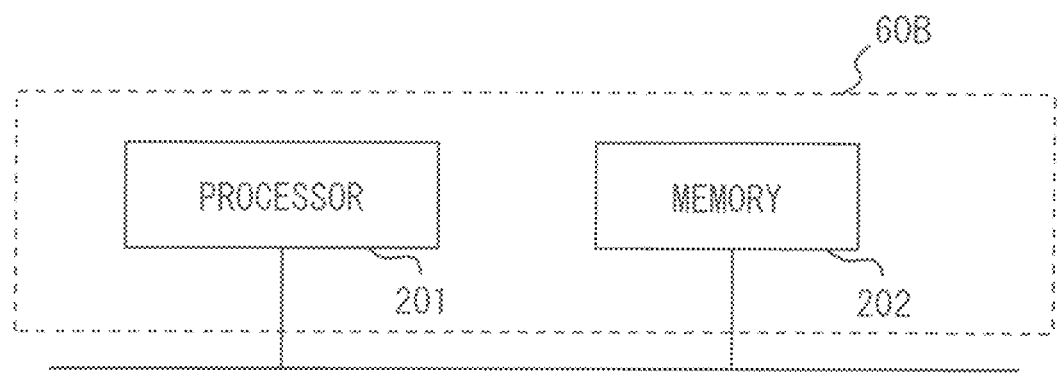
FIG. 11 is a configuration diagram showing another example of hardware for implementing functions of the signal processing device according to embodiment 1.

FIG. 11 is a configuration diagram showing another example of hardware for implementing the functions of the signal processing device 60 according to embodiment 1. In this case, a processing circuit 608 includes a processor 201 and a memory 202.

The processing circuit 608 implements the functions of the signal processing device 60 by software, firmware, or a combination of software and firmware. The software and the firmware are described as programs, which are stored in the memory 202. The processor 201 reads and executes the programs stored in the memory 202, to implement the functions.

It can be said that the pro grams stored in the memory 202 are for causing a computer to execute a procedure ox a method of each unit described above. Here, the memory 202 is, for example, a nonvolatile or volatile semiconductor memory such as a random access memory (RAM), a read only memory (ROM), a flash memory, an erasable programmable read only memory (EPROM), or an electrically erasable and programmable read only memory (EEPROM). Also, a magnetic disk, a flexible disk, an optical disc, a compact disc, a mini disc, a DVD, or the like may be used for the memory 202.

Of the functions of the signal processing device 60 described above, some may be implemented by dedicated hardware and others may be implemented by software or firmware.

Thus, the processing circuit can implement the functions of the signal processing device 60 described above by hardware, software, firmware, or a combination thereof.

Embodiment 2

Figure 12:
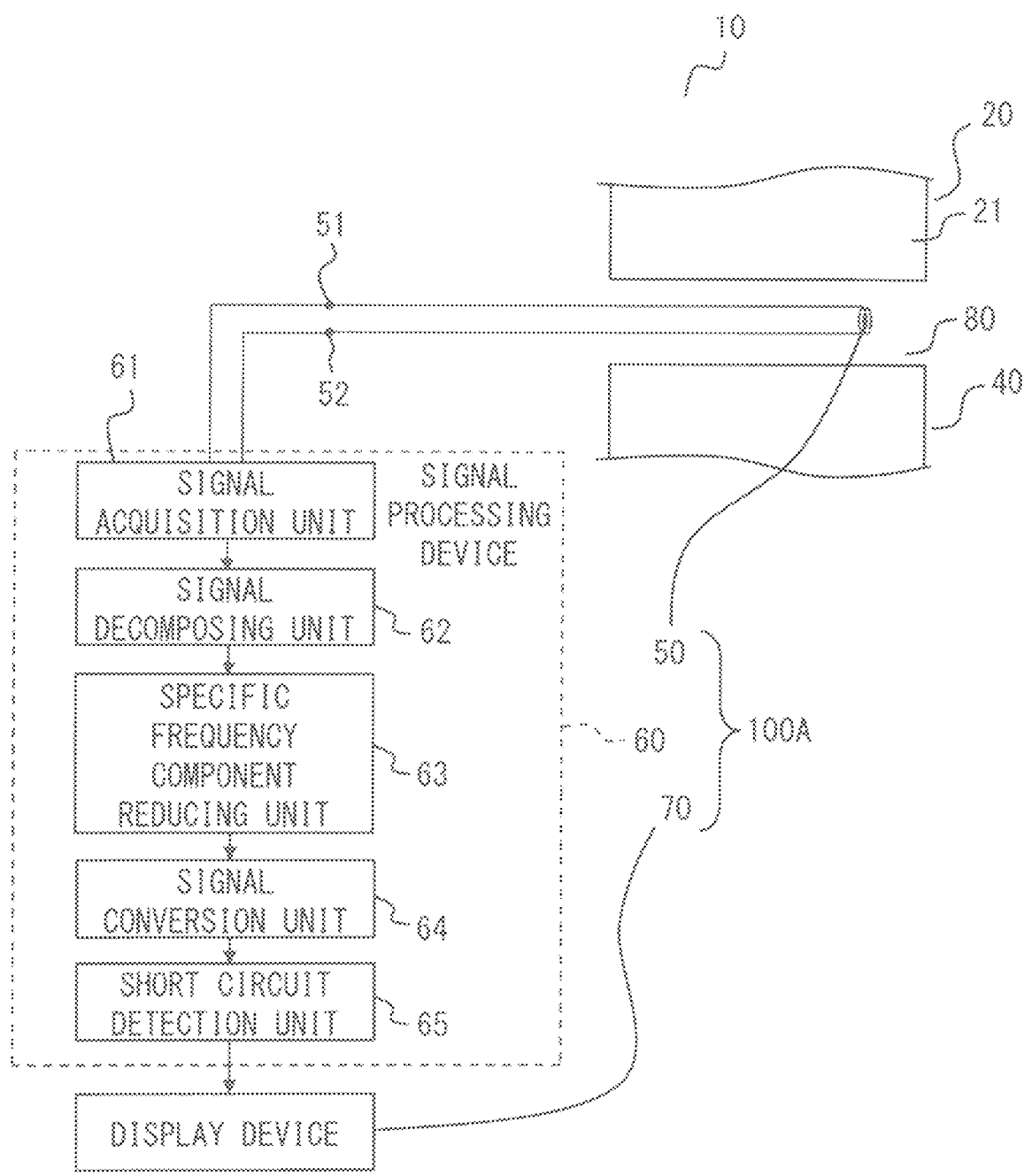
FIG. 12 is a configuration diagram showing a rotating electrical machine and a short circuit detection device according to embodiment 2.

In the above embodiment 1, the search coil 50 is placed inside the stator slot 23. However, in the turbine electric generator 10, a flow path may be provided in the stator core and a cooling air may flow therethrough, as in Patent Document 1. In this case, the search coil 50 may be provided in the flow path, FIG. 12 is a configuration diagram showing a rotating electrical machine and a short circuit detection device according to embodiment 2. The turbine electric generator 10 which is a rotating electrical machine is the same as that shown in embodiment 1 except that a flow path is provided. Some components are not shown in the drawings and description is omitted as appropriate. FIG. 12 shows an axial-direction sectional view of the turbine electric generator 10.

In embodiment 2, in the stator core 21, a plurality of flow paths 80 are provided in the axial direction so as to penetrate the stator core 21 in the radial direction, and cooling air flows through the flow paths 80.

As in the above embodiment 1, a short circuit detection device 100A includes the search coil 50, the signal processing device 60 for processing a detection signal from the search coil 50, and the display device 70, and detects short circuit of the field winding 32 of the turbine electric generator 10.

As shown in FIG. 12, the flow paths 80 are interposed between parts of the stator core 21 in the axial direction, and the search coil 50 is fixed in one flow path 80. The search coil 50 is opposed to the field winding 32 (not shown) with the gap 40 therebetween.

The radial-direction position of the search coil 50 in the flow path 80 can be determined in the same manner as the radial-direction position in the stator slot 23 in the above embodiment 1. That is, the search coil 50 is placed in the position range Sxy shown in FIG. 3 in the above embodiment 1.

In the simulation shown in the above embodiment 1, a proportion of presence of such a nonmagnetic part is also taken into consideration. Therefore, the same effects are provided even in a case where the search coil 50 is provided in the flow path 80.

Since the flow path 80 penetrates the stator core 21 in the radial direction, the search coil 50 and a lead wire thereof can be easily pulled out to the outer side of the turbine electric generator 10, In addition, there is an advantage that the search coil 50 does not become obstacle at the time of inspection for the stator wedge 24, unlike the case where the search coil 50 is placed in the stator slot 23.

Further, by inserting the search coil 50 from the outer side of the turbine electric generator 10 as necessary, it is possible to temporarily place the search coil 50 later only at the time of short circuit inspection for the field winding 32.

Although the disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS 10 turbine electric generator (rotating electrical machine)
20 stator
21 stator core
21A tooth end
22 multiphase winding
23 stator slot
25 tooth
30 rotor
32 field winding
33 rotor slot
36 first magnetic pole
37 second magnetic pole
40 gap
50 search coil (magnetic detector)
60 signal processing device
61 signal acquisition unit
62 signal decomposing unit
63 specific frequency component reducing unit
64 signal conversion unit
65 short circuit detection unit
80 flow path
100, 100A short circuit detection device
f function
d, y radial-direction distance
Sxy position range
Sp rotor slot pitch

The invention claimed is:

1. A short circuit detection device for a rotating electrical machine, comprising:
a magnetic detector placed so as to be opposed to a field winding provided to a plurality of slots of a rotor of the rotating electrical machine; and
a signal processing device for processing a signal from the magnetic detector,
the short circuit detection device being configured to detect short circuit of the field winding, wherein
the magnetic detector is placed inside a stator provided with a gap from the rotor, and
the signal processing device includes
a signal acquisition circuitry which acquires a voltage signal which is the signal from the magnetic detector,
a signal decomposing circuitry which decomposes the voltage signal acquired by the signal acquisition circuitry, into a plurality of frequency components having different orders,
a specific frequency component reducing circuitry which reduces, among the plurality of frequency components, a frequency component for an odd-number order and a frequency component for an even-number order higher than a threshold which is set to be an order lower than a fundamental order of a slot harmonic which is a harmonic having a correlation with a pitch of the plurality of slots,
a signal conversion circuitry which converts a plurality of frequency components outputted from the specific frequency component reducing circuitry, to a voltage signal, and
a short circuit detection circuitry which
divides the voltage signal converted by the signal conversion circuitry, into voltage signals for respective circumferential-direction angles around the rotor respectively corresponding to a plurality of magnetic poles of the rotor,
generates a difference waveform between the voltage signals corresponding to adjacent magnetic poles among the plurality of magnetic poles, and
on the basis of a shape of the difference waveform, detects short circuit of the field winding, and estimates a position in a circumferential direction around the rotor where the short circuit has occurred,
wherein the magnetic detector is placed inside a slot of the stator.

2. The short circuit detection device for the rotating electrical machine according to claim 1, wherein
the magnetic detector is a search coil.

3. The short circuit detection device for the rotating electrical machine according to claim 1, wherein
the magnetic detector is placed at a radial-direction position between a radial-direction position of a tooth end of the stator and a radial-direction position of a multiphase winding surface inside the stator, and in such a range that a distance from the magnetic detector to the radial-direction position of the tooth end becomes smaller as a maximum magnetic flux density at the tooth end of the stator due to rotation of the rotor becomes greater.

4. The short circuit detection device for the rotating electrical machine according to claim 3, wherein
the magnetic detector is a search coil.

5. The short circuit detection device for the rotating electrical machine according to claim 3, wherein
the magnetic detector is placed in such a range that a ratio of a radial-direction distance to a position of the magnetic detector relative to a radial-direction distance to the multiphase winding surface, from the tooth end as a reference of a radial-direction position, is within 0 to 100% and is limited by a function of the maximum magnetic flux density.

6. The short circuit detection device for the rotating electrical machine according to claim 5, wherein
where the maximum magnetic flux density is denoted by xT, the function is represented by the following expression:

$$801 \times 5.9((1.5 - x)^{\wedge}(5.9)) + 3.6.$$

7. The short circuit detection device for the rotating electrical machine according to claim 5, wherein
the magnetic detector is a search coil.

8. The short circuit detection device for the rotating electrical machine according to claim 5, wherein
the function is set so that the short circuit of the field winding is not erroneously detected, under a condition until a core of the stator is magnetically saturated.

9. The short circuit detection device for the rotating electrical machine according to claim 8, wherein
where the maximum magnetic flux density is denoted by xT, the function is represented by the following expression:

$$801 \times 5.9((1.5 - x)^{\wedge}(5.9)) + 3.6.$$

10. The short circuit detection device for the rotating electrical machine according to claim 8, wherein
the magnetic detector is a search coil.

11. A short circuit detection device for the rotating electrical machine comprising:
a magnetic detector placed so as to be opposed to a field winding provided to a plurality of slots of a rotor of the rotating electrical machine; and
a signal processing device for processing a signal from the magnetic detector,
the short circuit detection device being configured to detect short circuit of the field winding, wherein
the magnetic detector is placed inside a stator provided with a gap from the rotor, and
the signal processing device includes
a signal acquisition circuitry which acquires a voltage signal which is the signal from the magnetic detector,
a signal decomposing circuitry which decomposes the voltage signal acquired by the signal acquisition circuitry, into a plurality of frequency components having different orders,
a specific frequency component reducing circuitry which reduces, among the plurality of frequency components, a frequency component for an odd-number order and a frequency component for an even-number order higher than a threshold which is set to be an order lower than a fundamental order of a slot harmonic which is a harmonic having a correlation with a pitch of the plurality of slots,
a signal conversion circuitry which converts a plurality of frequency components outputted from the specific frequency component reducing circuitry, to a voltage signal, and
a short circuit detection circuitry which
divides the voltage signal converted by the signal conversion circuitry, into voltage signals for respective circumferential-direction angles around the rotor respectively corresponding to a plurality of magnetic poles of the rotor,
generates a difference waveform between the voltage signals corresponding to adjacent magnetic poles among the plurality of magnetic poles, and
on the basis of a shape of the difference waveform, detects short circuit of the field winding, and estimates a position in a circumferential direction around the rotor where the short circuit has occurred,
wherein
in the stator, a flow path of cooling air is formed in a radial direction, and
the magnetic detector is placed inside the flow path.

12. The short circuit detection device for the rotating electrical machine according to claim 11, wherein
the magnetic detector is a search coil.

13. The short circuit detection device for the rotating electrical machine according to claim 11, wherein
the magnetic detector is placed at a radial-direction position between a radial-direction position of a tooth end of the stator and a radial-direction position of a multiphase winding surface inside the stator, and in such a range that a distance from the magnetic detector to the radial-direction position of the tooth end becomes smaller as a maximum magnetic flux density at the tooth end of the stator due to rotation of the rotor becomes greater.

14. The short circuit detection device for the rotating electrical machine according to claim 13, wherein
the magnetic detector is a search coil.

15. The short circuit detection device for the rotating electrical machine according to claim 13, wherein
the magnetic detector is placed in such a range that a ratio of a radial-direction distance to a position of the magnetic detector relative to a radial-direction distance to the multiphase winding surface, from the tooth end as a reference of a radial-direction position, is within 0 to 100% and is limited by a function of the maximum magnetic flux density.

16. The short circuit detection device for the rotating electrical machine according to claim 15, wherein
where the maximum magnetic flux density is denoted by xT, the function is represented by the following expression:

$$801 \times 5.9((1.5 - x)^{\wedge}(5.9)) + 3.6.$$

17. The short circuit detection device for the rotating electrical machine according to claim 15, wherein
the magnetic detector is a search coil.

18. The short circuit detection device for the rotating electrical machine according to claim 15, wherein
the function is set so that the short circuit of the field winding is not erroneously detected, under a condition until a core of the stator is magnetically saturated.

19. The short circuit detection device for the rotating electrical machine according to claim 18, wherein
where the maximum magnetic flux density is denoted by xT, the function is represented by the following expression:

$$801 \times 5.9((1.5 - x)^{\wedge}(5.9)) + 3.6.$$

20. The short circuit detection device for the rotating electrical machine according to claim 18, wherein
the magnetic detector is a search coil.

* * * * *